(12) United States Patent
Morimoto et al.

(10) Patent No.: US 7,061,790 B2
(45) Date of Patent: Jun. 13, 2006

(54) SEMICONDUCTOR MEMORY DEVICE AND DATA WRITE METHOD

(75) Inventors: Hidenori Morimoto, Kashihara (JP); Koji Inoue, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/728,176

(22) Filed: Dec. 3, 2003

(65) Prior Publication Data

US 2004/0174739 A1    Sep. 9, 2004

(30) Foreign Application Priority Data

Dec. 3, 2002    (JP) .............................. 2002-351832

(51) Int. Cl.
    *G11C 11/00* (2006.01)
    *G11C 16/04* (2006.01)
(52) U.S. Cl. .................. 365/148; 365/158; 365/185.29
(58) Field of Classification Search ................ 365/158, 365/171, 173, 210, 148, 185.18, 185.19, 365/185.22, 185.29, 185.33
    See application file for complete search history.

(56) References Cited

U.S. PATENT DOCUMENTS

| 5,323,351 | A | 6/1994 | Challa |
| 5,440,505 | A | 8/1995 | Fazio et al. |
| 5,748,538 | A | 5/1998 | Lee et al. |
| 6,204,139 | B1 | 3/2001 | Liu et al. |
| 6,269,040 | B1 * | 7/2001 | Reohr et al. ................ 365/210 |
| 6,473,332 | B1 * | 10/2002 | Ignatiev et al. ............. 365/148 |
| 6,614,682 | B1 * | 9/2003 | Hirai .......................... 365/158 |
| 6,625,057 | B1 * | 9/2003 | Iwata ......................... 365/158 |
| 6,862,213 | B1 * | 3/2005 | Hamaguchi ................ 365/158 |
| 2002/0154531 | A1 | 10/2002 | Lowrey et al. |
| 2003/0206435 | A1 | 11/2003 | Takahashi |

FOREIGN PATENT DOCUMENTS

| WO | WO-0049659 A1 | 8/2000 |
| WO | WO-02/50843 A1 | 6/2002 |

OTHER PUBLICATIONS

European Search Report mailed on Feb. 3, 2006 for EP Application No. 03257605.0, 3 pages.

* cited by examiner

*Primary Examiner*—Trong Phan
(74) *Attorney, Agent, or Firm*—Morrison & Foerster LLP

(57) ABSTRACT

A semiconductor memory device including a plurality of memory cells is provided. One of the plurality of memory cells includes a variable resistor having a resistance value thereof reversibly changed in accordance with a voltage applied thereto, and a transistor connected to the variable resistor.

10 Claims, 12 Drawing Sheets

SEMICONDUCTOR MEMORY DEVICE AND DATA WRITE METHOD

BACKGROUND OF THE INVENTION

1. Field of the Invention

The present invention relates to a semiconductor memory device and a data write method, and more specifically to a semiconductor memory device including a plurality of memory cells and a method for writing data to such a semiconductor memory device.

2. Description of the Related Art

Recently, semiconductor memory devices such as, for example, non-volatile memories have significantly improved in performance in terms of the degree of integration, data processing rate and the like. Especially, a flash memory which is a non-volatile memory is widely used in compact information devices for personal terminals, for example, cellular phones. Flash memory is one type of EEPROM (Electrically Erasable Programmable Read Only Memory). A flash memory includes a plurality of memory cells. Each memory cell includes a MOS transistor having a floating gate which is electrically separated from the other elements in the memory cell.

FIG. 8 is a schematic cross-sectional view of a memory cell 100 included in a flash memory.

As shown in FIG. 8, the memory cell 100 includes a semiconductor substrate 101, a drain region 102 and a source region 103. The drain region 102 and the source region 103 are provided on the semiconductor substrate 101. The drain region 102 and the source region 103 have a prescribed distance therebetween. The source region 103 and the drain region 102 are doped with dopants (impurity elements) which generate different conductivities. Surfaces of the drain region 102, the source region 103, and a portion of the semiconductor substrate 101 between the drain region 102 and the source region 103 are covered with a first insulating layer 104 which is a gate insulating layer. Above the portion of the semiconductor substrate 101 between the drain region 102 and the source region 103, a floating gate 105 formed of polysilicon, a second insulating layer 106 formed of $SiO_2$, and a control gate 107 formed of polysilicon are sequentially provided. The first insulating layer 104 is interposed between the semiconductor substrate 101 and the floating gate 105. In a final state of the memory cell 100, both of two side surfaces of the floating gate 105 are covered with an insulating layer (not shown), and thus the floating gate 105 is in an electrically floating state. The second insulating layer 106 electrically separates the floating gate 105 and the control gate 107.

Generally in the field of flash memory, injection of hot electrons, generated in a channel region between the drain region 102 and the source region 103 in the memory cell 100, into the floating gate 105 is associated with writing of data to the memory cell 100 (programming).

More specifically, when a high electric field is applied to between the drain region 102 and the source region 103, a large magnitude of current flows in the channel region. As a result, hot electrons are generated in a portion in the channel region which is close to the drain region 102 and has a high electric field. The hot electrons are injected into the floating gate 105, and charges are accumulated in the floating gate 105. This changes the threshold voltage (Vth) as a transistor characteristic of the MOS transistor included in the memory cell 100 and data is written to the memory cell 100. The threshold voltage (Vth) is defined as a minimum voltage, applied to the control gate 107, which is required to put the channel region between the source region 103 and the drain region 102 into a conductive state. The threshold voltage (Vth) is controlled by the amount of charge accumulated in the floating gate 105.

FIG. 9 schematically shows voltage conditions for writing data to the memory cell 100 shown in FIG. 8.

For writing data to the memory cell 100, a program voltage of about 12 V is applied to the control gate 107, a drain voltage of about 6 V is applied to the drain region 102, and a reference voltage of 0 V is applied to the source region 103 and the channel region in the semiconductor substrate 101 (as shown in FIG. 8).

Under such voltage conditions, the hot electrons generated as described above, in the portion having the high electric field, are injected into the floating gate 105 through the first insulating layer 104 by the program voltage of about 12 V applied to the control gate 107. The floating gate 105 is charged negative. As a result, the memory cell 100 is put into a data write (program) state.

In the data write (program) state, the hot electrons are collected in to the floating gate 105 and the threshold voltage (Vth) of the memory cell 100 is increased. Thus, the threshold voltage (Vth) of the memory cell 100 becomes a threshold voltage in the data write (program) state. When the above-mentioned voltage conditions are changed to remove the electrons (negative charges) from the floating gate 105 and thus lower the threshold voltage (Vth) of the memory cell 100, the memory cell 100 is put into a data erase state.

FIG. 10 is a graph illustrating a threshold voltage distribution of memory cells included in a general 2-value flash memory.

The horizontal axis represents the threshold voltage (Vth) of the memory cells, and the vertical axis represents the number of the memory cells. In FIG. 10, the reference threshold voltage at the center of the horizontal axis represents the read voltage which is applied to a control gate of each memory cell for reading data from the memory cell.

Generally in a 2-value flash memory, the state in which the electrons (negative charges) are removed from the floating gate of the memory cell is the data erase state, and such a state is associated with data "1". The state in which the electrons are injected to the memory cell is the data write state, and such a state is associated with data "0".

In FIG. 10, the portion of the graph with the threshold voltage lower than (to the left of) the reference threshold voltage shows a distribution of the data erase threshold voltage representing the threshold voltage of memory cells in the data erase state, and the portion of the graph with the threshold voltage higher than (to the right of) the reference threshold voltage shows a distribution of the data write threshold voltage representing the threshold voltage of memory cells in the data write state.

As shown in FIG. 10, the memory cells in the data erase state have a low threshold voltage and the memory cells in the data write state have a high threshold voltage. Accordingly, where an equal voltage is applied to the control gate of each memory cell, the memory cells in the data erase state have a larger magnitude of current flowing therethrough than the memory cells in the data write state. Thus, utilizing the fact that the current value of the memory cells in the data erase state is different form the current value of the memory cells in the data write state, it can be checked whether data is present in a memory cell or not (state of data). Such a checking operation is referred to as a data read operation or a data verifying operation.

In the data read operation or the data verifying operation, a reference cell in which the prescribed reference voltage is set is compared with a memory cell to be checked.

Specifically, the value of current flowing in the reference cell is compared with the value of current flowing in the memory cell to be checked. By comparing the values of the currents, data can be read.

More specifically, the value of current flowing in the bit line connected to the memory cell and the value of current flowing in the bit line connected to the reference cell are detected by a sense amplifier, and the values of these currents are compared. Thus, it is determined whether data is present in the memory cell or not.

In a flash memory, the data write threshold voltage can be changed to a prescribed value by controlling the amount of charge accumulated in the floating gate 105 in the memory cell 100 shown in FIG. 8. Thus, data of multi-value information which is different from the previously processed information can be written.

FIG. 11 is a graph illustrating an exemplary threshold voltage distribution of memory cells included in a multi-value flash memory which is capable of writing multi-value data. For the sake of simplicity, FIG. 11 shows the distribution in the case of a 4-value flash memory in which one memory cell can store 2-bit data.

In FIG. 11, the horizontal axis represents the threshold voltage of memory cells and the vertical axis represents the number of the memory cells. Reference threshold voltages A, B and C each represent a data read voltage applied to the control gates of the memory cells for reading data.

Each memory cell in the 4-value flash memory can be selectively in one of four states, i.e., one data erase state and three data write states. The four states correspond to the four threshold voltage distributions of the memory cells. The lowest threshold voltage corresponds to the data erase state, and the other three threshold voltages correspond to the data write states. When a memory cell can be selectively in one of these four states, the three reference voltages A, B and C are set as shown in FIG. 11 for the data read operation of confirming the presence of data in the memory cells.

In the memory cells shown in FIG. 11, each memory cell can store 2-bit data. The data corresponding to the lowest threshold voltage distribution is defined as "11". The data corresponding to the second lowest threshold voltage distribution is defined as "10". The data corresponding to the third lowest threshold voltage distribution is defined as "01". The data corresponding to the highest threshold voltage distribution is defined as "00". Data "11" represents the data erase state. In the data write states in which data is defined as "10", "01" and "00", the range of the threshold voltage distribution corresponding to each level of data is narrower than that in the case of a 2-value flash memory shown in FIG. 10. Therefore, the amount of charge in the floating gate is accurately controlled such that the variance in each threshold voltage distribution is sufficiently small.

As shown in FIG. 11, a multi-value flash memory capable of storing multi-value information can increase the memory capacity without increasing the number of memory cells. Therefore, the use of such a multi-value flash memory is effective for increasing memory capacity or for reducing the size of the circuit for an equal memory capacity.

FIG. 12 is a flowchart of a data write operation (programming) performed to a flash memory as shown in FIG. 10 or 11 (see, for example, U.S. Pat. No. 5,440,505). Although not shown, each memory cell is connected as follows. The control gate is connected to a prescribed word line WL, and the drain region is connected to a prescribed bit line BL. The memory cells are arranged in a matrix.

The data write operation is performed as follows.

First, a memory cell in the data erase state is selected, and a data write operation to the selected data is started (step S501).

Next, first data write (program) voltages are set as follows (step S502).

(1) Vwl=V01 (voltage to be applied to the word line WL)
(2) Vbl=V02 (voltage to be applied to the bit line BL)
(3) t=t01 (voltage pulse width of Vwl and Vbl)

For example, in a 4-value flash memory, the voltages are applied as follows: Vwl=8.0 V and Vbl=5.0 V. In a 2-value flash memory, Vwl=12.0 V is applied. In the 4-value flash memory, the voltage Vwl can be reduced to 8.0 V since the fluctuation of the threshold voltage (Vth) of each memory cell corresponding to each level of data in the 4-value flash memory is smaller than in the 2-value flash memory. Since the voltage Vwl can be lower, the load on the charge pump circuit for generating a high voltage can be alleviated.

Next, the first data write voltages of Vwl and Vbl are applied to the selected memory cell, and the voltages are held for voltage pulse width t01 (step S503).

Then, a verifying operation is performed on the threshold voltage of the memory cell to which data has been written (step S504). As described above, the verifying operation is an operation for checking the threshold voltage of a memory cell to confirm whether or not data (information) has been written to the memory cell as expected.

When the threshold voltage of the memory cell to which data has been written is in a prescribed range (YES in step S505), the data write operation is completed (step S506). When the threshold voltage of the memory cell to which data has been written has exceeded the prescribed range (YES in step S507), the data write operation to the memory cell results in a failure (step S508). When the threshold voltage of the memory cell to which data has been written has not yet reached the prescribed range (NO in step S507), the data write voltages are applied again to the memory cell and the verifying operation is performed again.

When the threshold voltage of the memory cell has not yet reached the prescribed range, the first data write voltage Vwl is increased by a prescribed voltage value ($\Delta V$), for example, 0.5 V, to Vwl=8.5 V (step S509).

Next, second data write (program) voltages are set as follows (step S510).

(1) Vwl=V03 (=V01+$\Delta V$) (in step S509)
(2) Vbl=V02
(3) t=t02 (t02<t01)

Voltage width t02 of the second data write voltages is set to be shorter than the voltage pulse width of the first data write voltages, and the time period in which the second data write voltages are applied is shorter than the time period in which the first data write voltages are applied.

Next, until the second data write voltage Vwl, and the number of times that the data write operation to the memory cell (programming) has been performed, both reach the maximum values (steps S511 and S512), steps S503 through S512 are repeated such that the threshold voltage in the memory cell reaches the prescribed range.

When the second data write voltage Vwl, and the number of times that the data write operation to the memory cell (programming) has been performed, both reach the maximum values (YES in steps S511 and S512), the data write operation to the memory cell results in a failure (step S508). As shown in steps S507 and S508, when the threshold voltage of the memory cell to which data has been written has exceeded the prescribed range (YES in step 507), 1-bit data cannot be erased because of the flash memory cell array structure. Therefore, the data write operation to this memory cell results in a failure.

There is a tendency that memory capacity of flash memories is desired to be increased. For example, as the level of multi-value information increases from 4 (4-value information) to 16 (16-value information), the range of the threshold voltage distribution of the memory cells corresponding to each level of data is further narrowed. Therefore, even when a data write operation to memory cells is performed with an extreme care in accordance with the flowchart shown in FIG. 12, it is possible that the threshold voltage of a memory cell has exceeded the prescribed range of the threshold voltage threshold distribution due to, for example, the variance in the transistor characteristics of the MOS transistor included in the memory cell, and as a result, incorrect data is written to the memory cell.

In this case, it is necessary to erase the data (information) in the memory cell and perform the data write operation again. In a flash memory, due to its cell array structure, data erase is performed block by block, each block including a plurality of memory cells. Therefore, when incorrect data is written to one memory cell in a certain block, it is necessary to (i) first write the data, which has been written to the other memory cells in the same block, to the memory cells in another block, (ii) erase the data in the certain block, and then (iii) write back the data, which has been written to the another block, to the memory cells in the certain block.

Generally in a flash memory, data can be erased from a memory cell in a time period in the order of milliseconds, whereas data can be written into a memory cell in a time period in the order of microseconds. Data erase is significantly more time-consuming than data write. Accordingly, use of the above-described method to write data to each memory cell in the flash memory significantly extends the time necessary to complete the data write operation (programming).

SUMMARY OF THE INVENTION

According to one aspect of the invention, a semiconductor memory device includes a plurality of memory cells. One of the plurality of memory cells includes a variable resistor having a resistance value thereof reversibly changed in accordance with a voltage applied thereto, and a transistor connected to the variable resistor.

In one embodiment of the invention, the transistor is a MOS transistor.

In one embodiment of the invention, the resistance value of the variable resistor is set to reach a plurality of non-overlapping ranges.

In one embodiment of the invention, the variable resistor is formed of a material having a perovskite type crystalline structure.

In one embodiment of the invention, the transistor includes a source, a gate, and a drain, and one of the source and the drain is connected to a bit line via the variable resistor, and the gate is connected to a word line.

In one embodiment of the invention, a voltage of a prescribed polarity is applied to the bit line, and a voltage lower than the voltage of the prescribed polarity is applied to the word line, so that the one memory cell is selected from the plurality of memory cells and data is written to the one memory cell.

In one embodiment of the invention, a voltage of a polarity opposite to the prescribed polarity is applied to the bit line, and a voltage lower than the voltage of the prescribed polarity is applied to the word line, so that the one memory cell is selected from the plurality of memory cells and data is erased from the one memory cell.

According to another aspect of the invention, a data write method for writing data to a memory cell is provided. The memory cell includes a variable resistor having a resistance value thereof reversibly changed in accordance with a voltage applied thereto, and a transistor connected to the variable resistor. The data write method includes a first step of applying a first data write voltage to the memory cell; a second step of, after the first data write voltage is applied, determining whether or not the resistance value of the variable resistor is within a prescribed range; a third step of, when the resistance value of the variable resistor has not reached the prescribed range, applying a second data write voltage which is higher than the first data write voltage to the memory cell; and a fourth step of repeating the second step and the third step until the resistance value of the variable resistor reaches the prescribed range.

In one embodiment of the invention, the data write method further includes a fifth step of, when the resistance value of the variable resistor exceeds the prescribed range, applying a data erase voltage to the variable resistor; a sixth step of, after the data erase voltage is applied, determining whether or not the resistance value of the variable resistor has reached a data erase range; and a seventh step of repeating the fifth step and the sixth step until the resistance value of the variable resistor reaches the data erase range and then applying the first data write voltage to the memory cell.

In one embodiment of the invention, the third step includes a step of applying the second data write voltage in a time period which is shorter than a time period in which the first data write voltage is applied in the first step.

A memory cell included in a semiconductor memory device according to the present invention includes a variable resistor having a resistance value thereof reversibly changed in accordance with a voltage applied thereto, and a transistor connected to the variable resistor. By selecting a word line and a bit line in accordance with the address of a target memory cell, the target memory cell is selected from a plurality of memory cells. By applying a data write voltage or a data erase voltage to the variable resistor via the bit line connected to the target memory cell, data is written to the target memory cell or data is erased from the target memory cell.

Thus, a semiconductor memory device according to the present invention can store multi-value information. Even when incorrect data is written to a memory cell, such data can be erased on a memory-cell-by-memory-cell basis. Therefore, the data write operation can be performed at high speed (i.e., in a short time).

Thus, the invention described herein makes possible the advantages of providing a semiconductor memory device for allowing data to be erased on a memory-cell-by-memory cell basis and allowing a data write operation to be performed at a high speed (in a short time) with high precision, and a data write method used for such a semiconductor memory device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
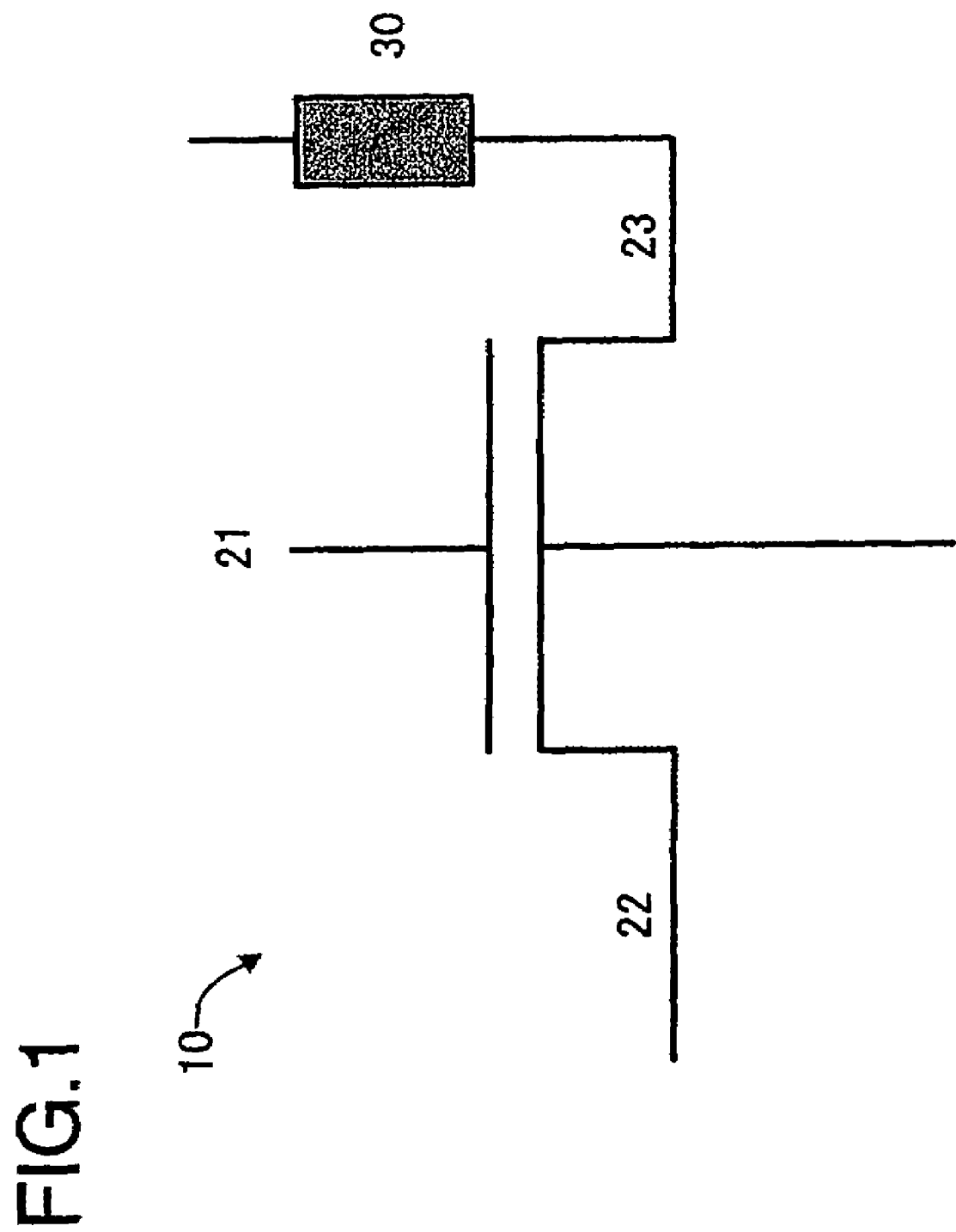
FIG. 1 is a schematic view of a memory cell usable in a semiconductor memory device according to the present invention.

FIG. 1 is a schematic view of a non-volatile semiconductor memory cell (hereinafter, referred to as the "memory cell") 10 included in a semiconductor memory device according to the present invention.

The memory cell 10 includes a transistor having a gate electrode 21, a source region 22 and a drain region 23, and a variable resistor 30 which is a memory carrier connected to the drain region 23. The transistor and the variable resistor 30 are formed on a semiconductor substrate (not shown). Here, the transistor is a MOS transistor.

The variable resistor 30 which is a memory carrier for the memory cell 10 has the resistance value thereof reversibly changed continuously by a voltage or voltages applied between both ends of the variable resistor 30. Even after the voltage application is terminated, the resistance value of the variable resistor 30 can be retained.

The variable resistor 30 is produced using, for example, $Pr_{(1-x)}Ca_{(x)}MnO_3$, $La_{(1-x)}Ca_{(x)}MnO_3$, or $Nd_{(1-x)}Sr_{(x)}MnO_3$ (0<x<1) disclosed in, for example, the U.S. Pat. No. 6,204,139. These materials have a perovskite type crystalline structure which exhibits a super high magnetic resistance and a high temperature superconductivity.

When a pulse voltage is applied to both ends of the variable resistor 30 produced using, for example, $Pr_{(1-x)}Ca_{(x)}MnO_3$, $La_{(1-x)}Ca_{(x)}MnO_3$, or $Nd_{(1-x)}Sr_{(x)}MnO_3$ (0<x<1), the resistance value thereof is continuously changed in accordance with the number of times that the pulse voltage is applied.

Figure 7:
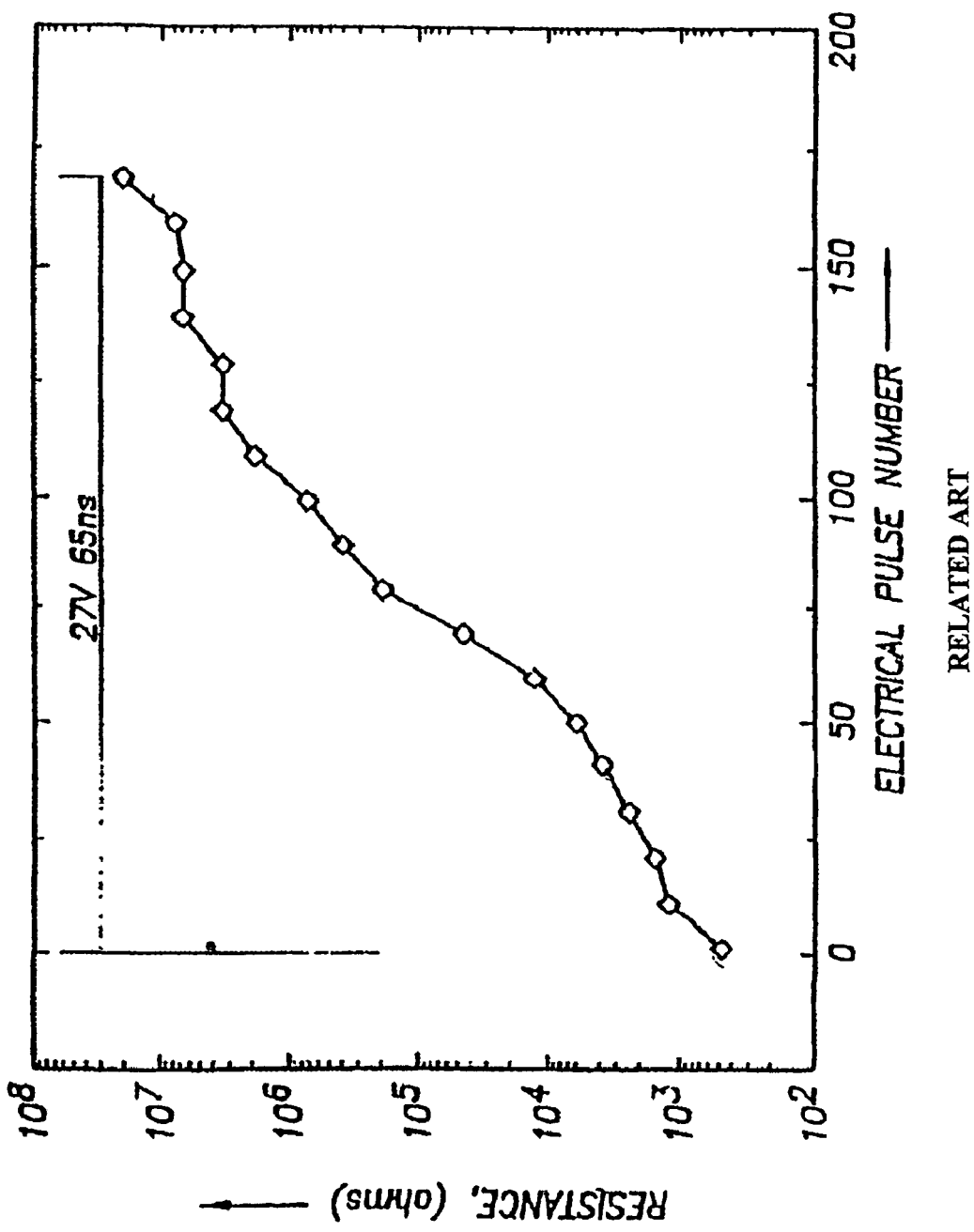
FIG. 7 is a graph illustrating the change in the resistance value of a variable resistor formed of a material having a perovskite type crystalline structure, in accordance with the number of times that the pulse voltage is applied.
Figure 8:
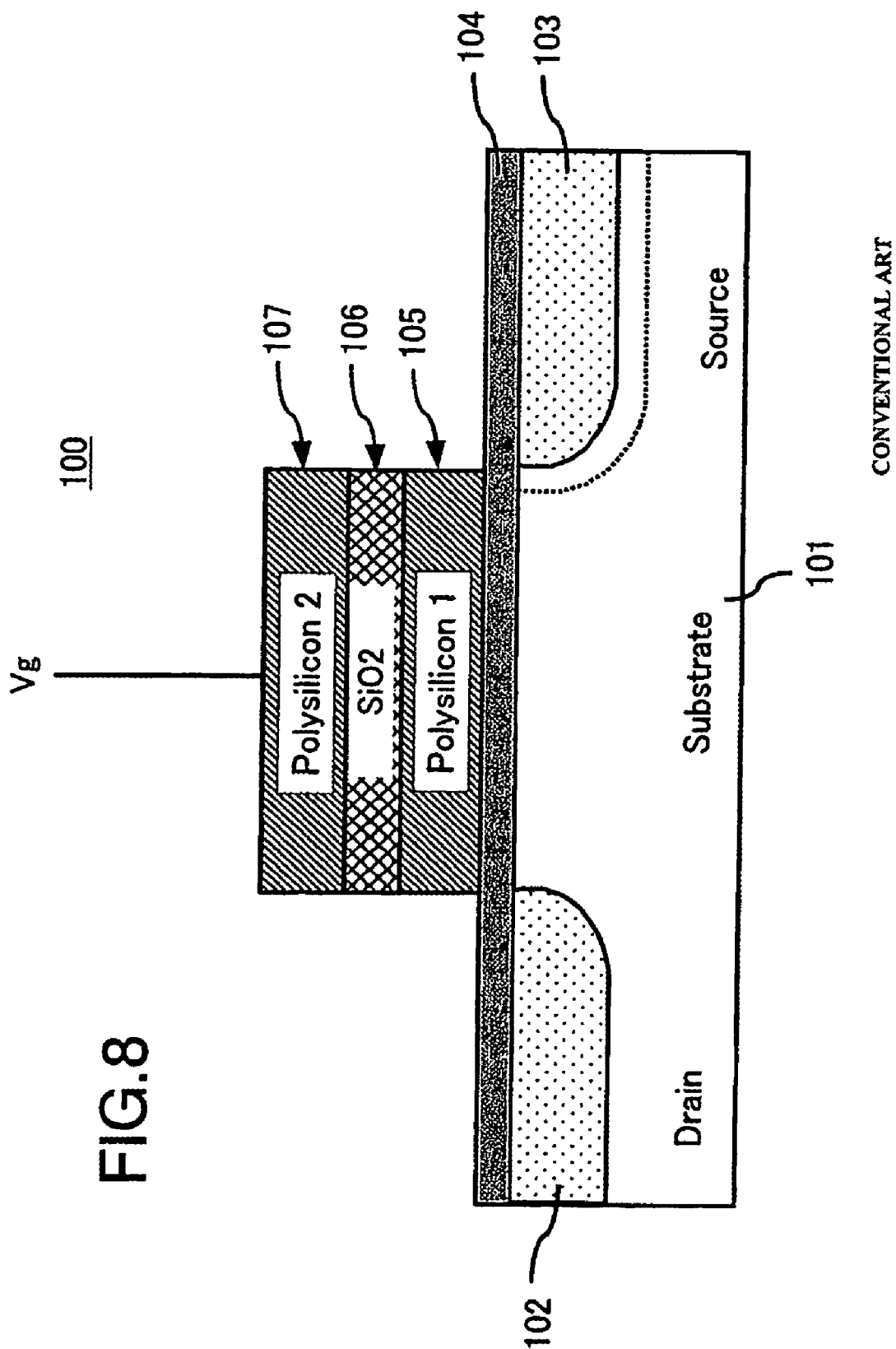
FIG. 8 is a schematic cross-sectional view of a memory cell in a conventional flash memory.
Figure 9:
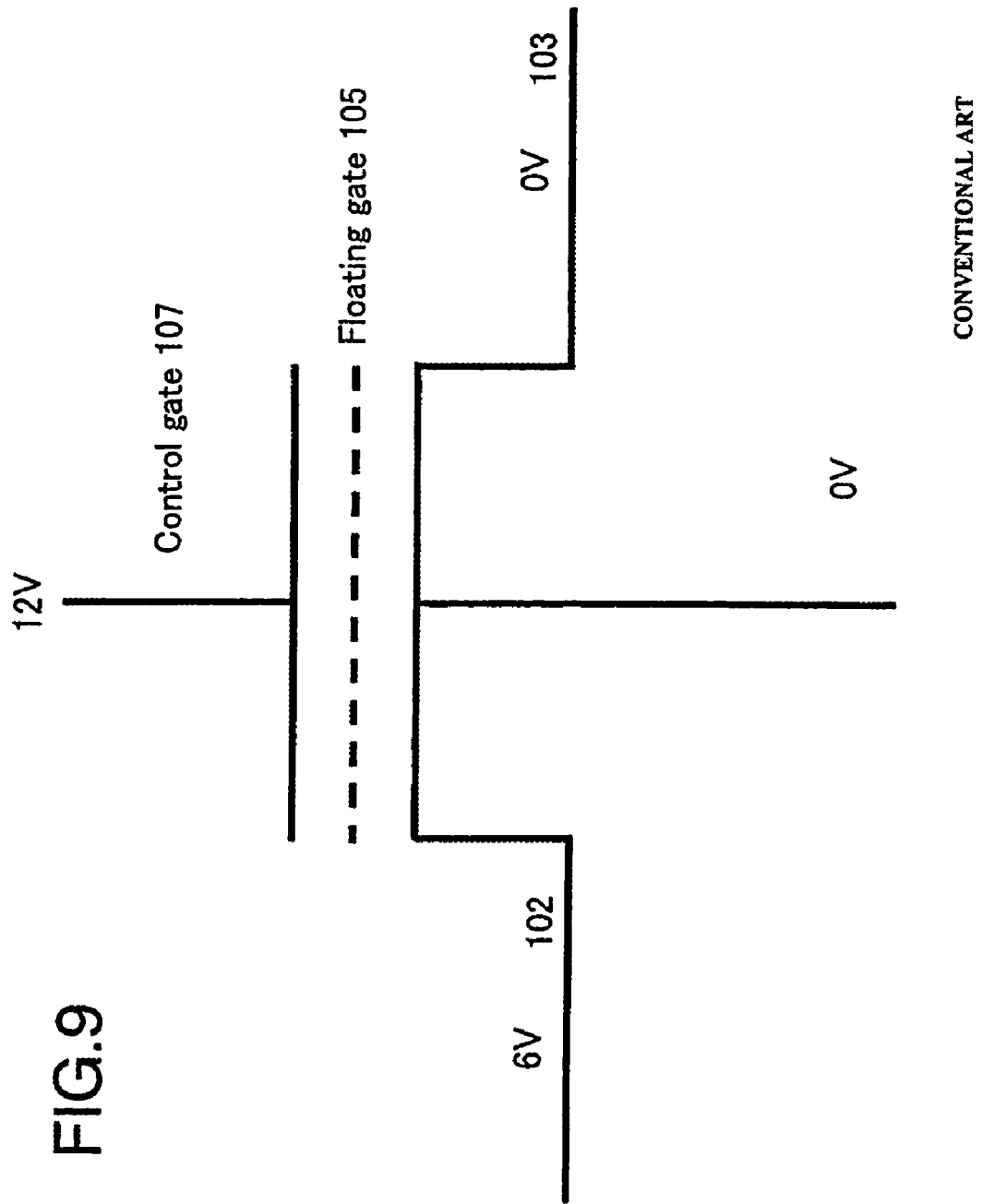
FIG. 9 is a schematic view illustrating the voltage conditions when data is written into the memory cell shown in FIG. 8.
Figure 10:
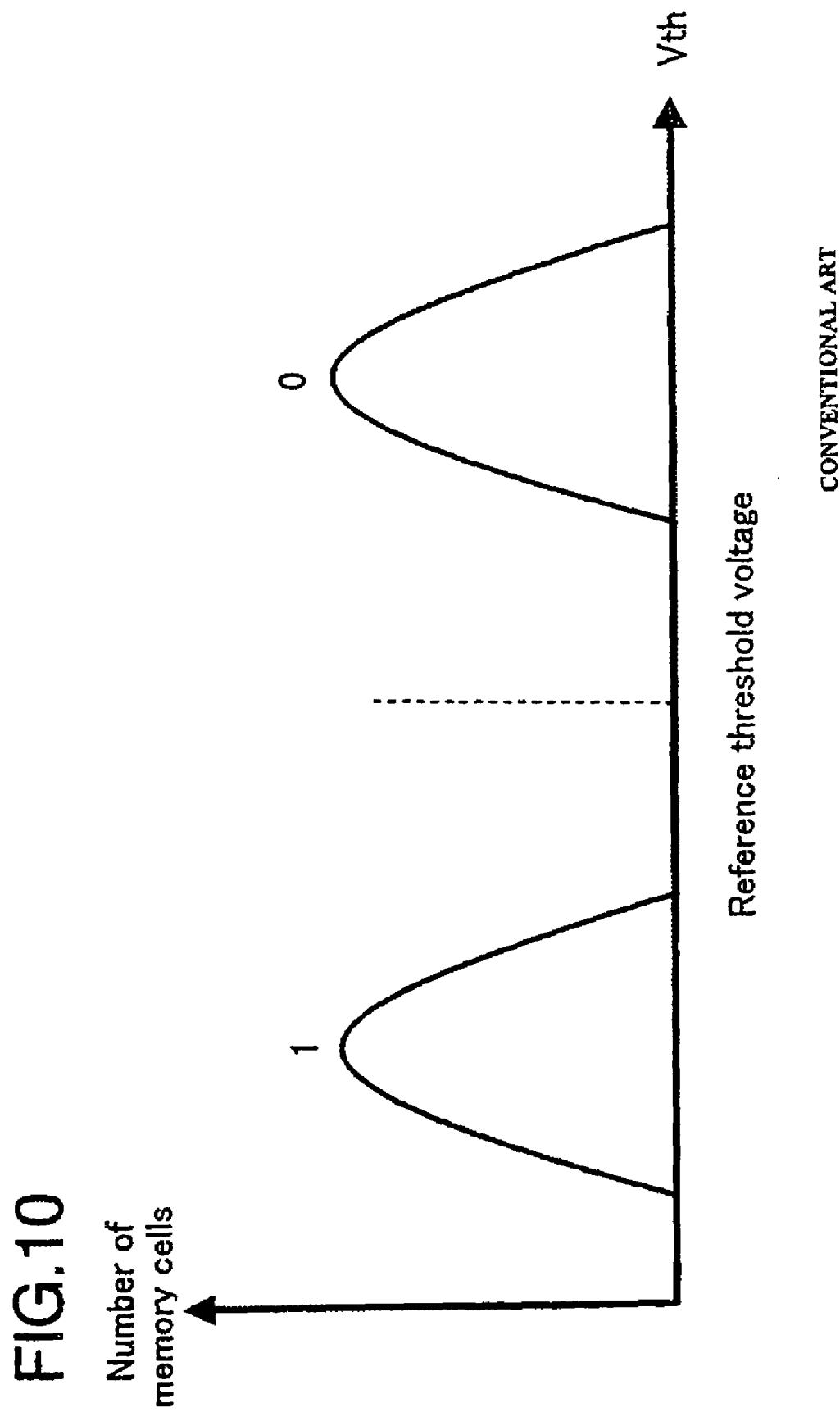
FIG. 10 is a graph illustrating the threshold voltage distribution of a memory cell included in a conventional 2-value flash memory.
Figure 11:
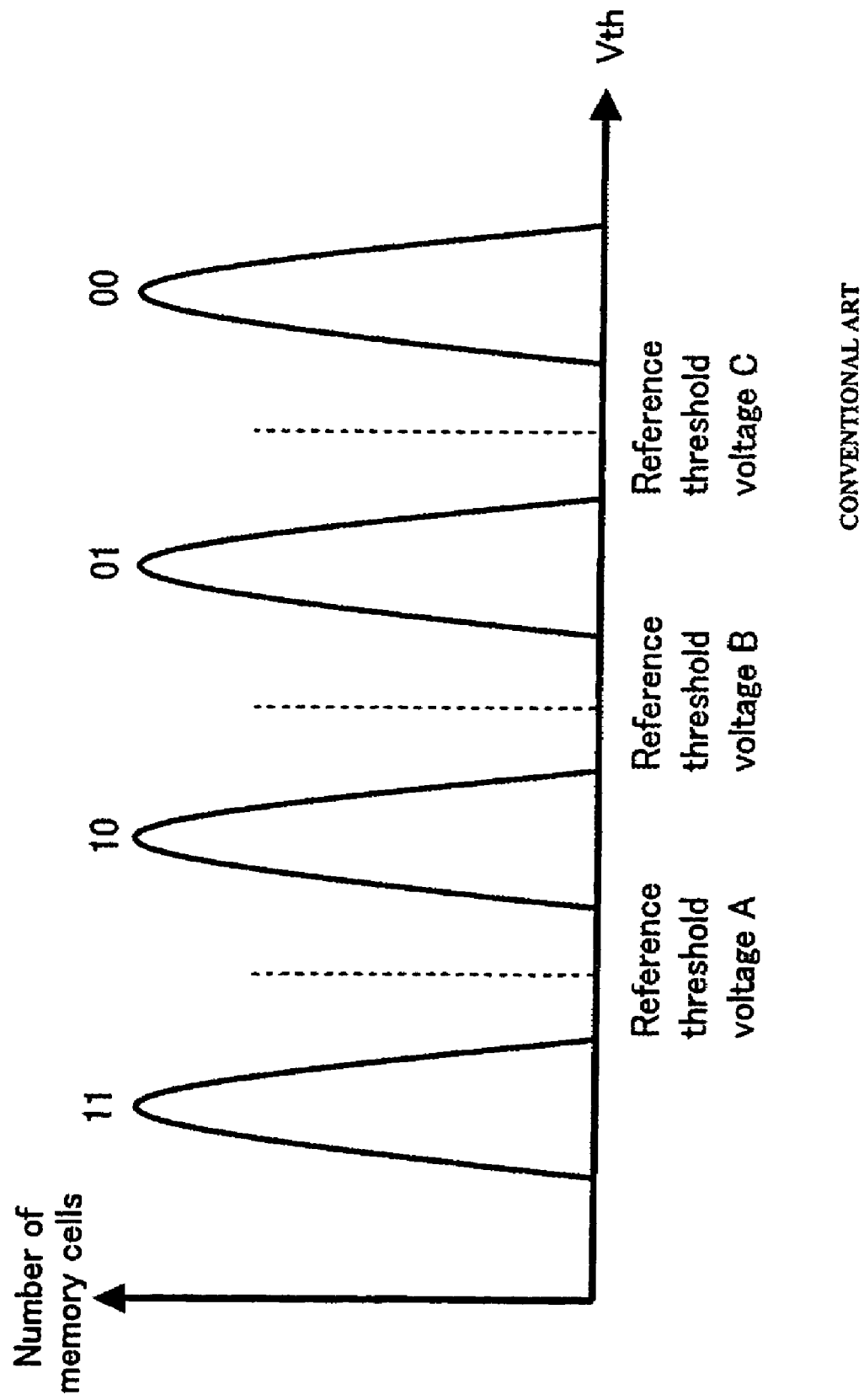
FIG. 11 is a graph illustrating an exemplary threshold voltage distribution of a memory cell included in a multi-value flash memory.
Figure 12:
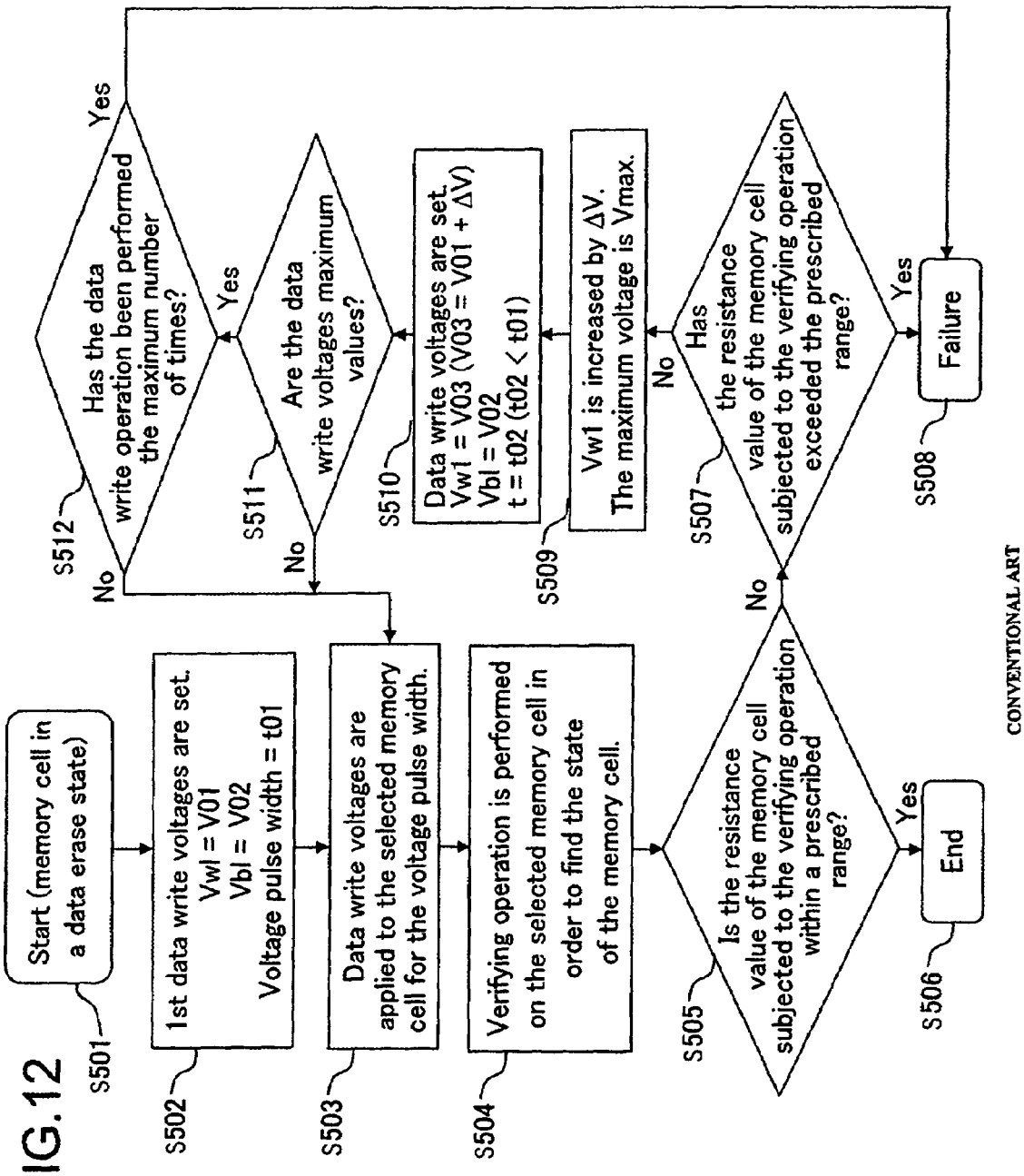
FIG. 12 is a flowchart illustrating an operation for writing data (programming) to a conventional flash memory.

FIG. 7 is a graph illustrating the change in the resistance value when a pulse voltage of the same polarity is applied a plurality of times. The horizontal axis represents the number of times that the pulse voltage is applied, and the vertical axis represents the resistance value of the variable resistor.

As shown in FIG. 7, as the number of times that the pulse voltage of the same polarity is applied increases, the resistance value of the variable resistor increases.

Owing to such a characteristic of the variable resistor 30, the semiconductor memory cell 10 including the variable resistor 30 as a memory carrier can store multi-value information by the amount of change in the resistance value of the variable resistor 30 being controlled. This is like the memory cell of the flash memory which can store multi-value information by the threshold voltage being continuously changed in accordance with the amount of charge injected to the floating gate. Specifically, the resistance value of the variable resistor 30 is set to reach a plurality of non-overlapping ranges.

Figure 2:
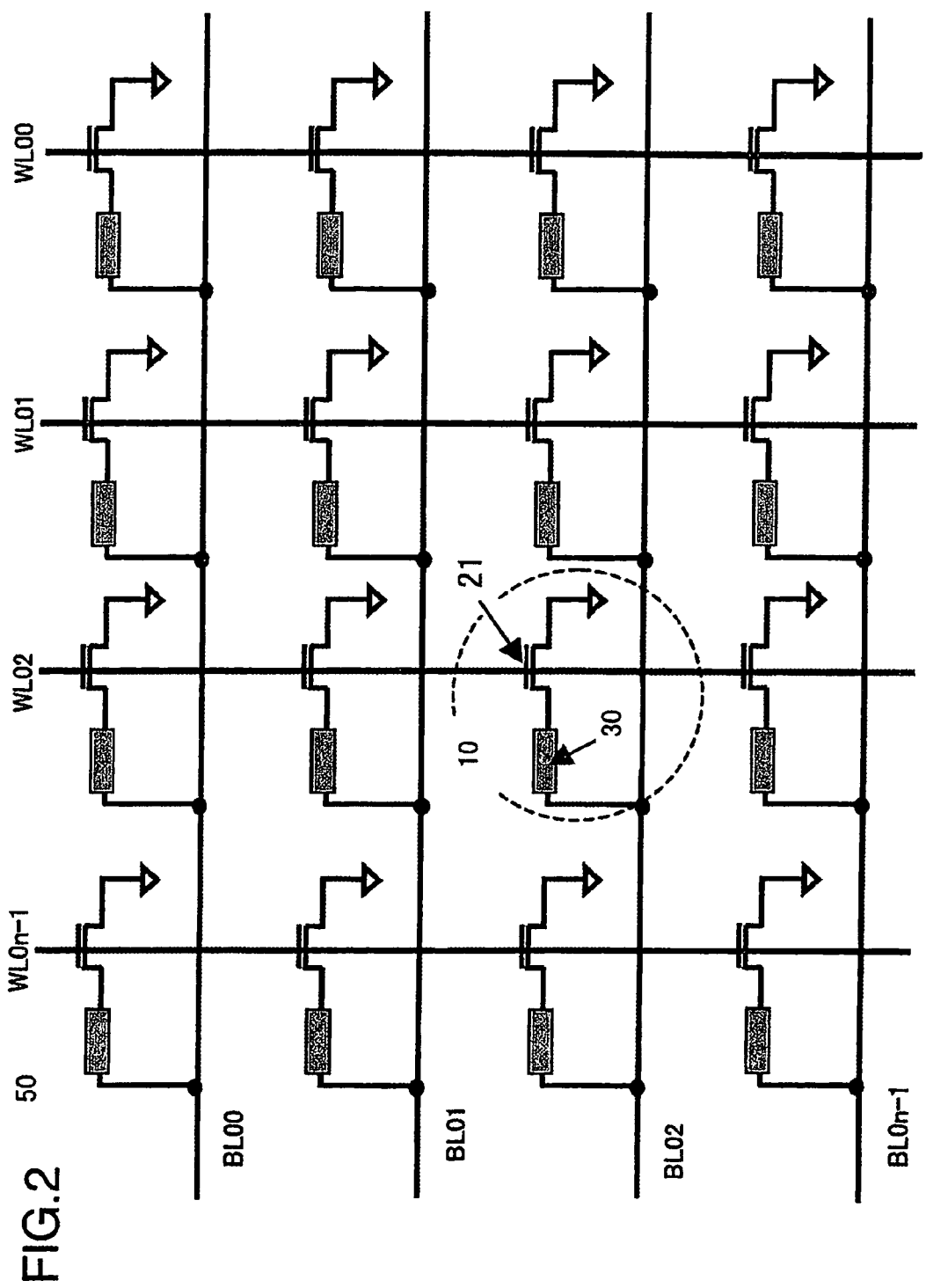
FIG. 2 shows an example of a memory array according to one example of the present invention.

FIG. 2 shows an exemplary structure of a memory array 50 according to one example of the present invention.

The memory array 50 includes a plurality of non-volatile semiconductor memory cells 10. The gate electrode 21 of each memory cell 10 is connected to the respective line of word lines WL00 through WL0n−1. The variable resistor 30 connected to the drain region 23 (as shown in FIG. 1) which is a driving region of each memory cell 10, is connected to the respective bit line of bit lines BL00 through BL0n−1. The memory cells 10 are arranged in a matrix.

Each memory cells 10 in the memory array 50 is selected by a prescribed control voltage applied to the respective word line of the word lines WL00 through WL0n−1 and to the respective bit line of the bit lines BL00 through BL0n−1. Data is written to, or erased or read from the selected memory cell 10.

Operations for writing data to, or erasing or reading data from, a selected memory cell 10 will be described. As an example, the memory cell 10 in the circle in FIG. 2 selected by the word line WL02 and the BL02 is used as the selected memory cell 10.

For writing data to the selected non-volatile semiconductor memory cell 10, for example, Vwl=3.0 V is applied to the word line WL02 and Vbl=5.0 V is applied to the bit line BL02. The voltages applied to the non-selected word lines WL00, WL01 and WL03 through WL0n−1 and the non-selected bit lines BL00, BL01 and BL03 through BL0n−1 are set as Vwl=Vbl=0 V. As a result, the resistance value of the variable resistor 30 of the selected memory cell 10 is changed from an initial state. Thus, data corresponding to the amount of change in the resistance value of the variable resistor 30 is written to the selected memory cell 10.

For erasing data stored in the selected memory cell 10, for example, Vwl=3.0 V is applied to the word line WL02 and Vbl=−5.0 V is applied to the bit line BL02. The voltages applied to the non-selected word lines WL00, WL01 and WL03 through WL0n−1 and the non-selected bit lines BL00, BL01 and BL03 through BL0n−1 are set as Vwl=Vbl=0 V. As a result, the resistance value of the variable resistor 30 of the selected memory cell 10 is decreased to the initial state (data erase state). Thus, data corresponding to the amount of change in the resistance value of the variable resistor 30 is erased from the selected memory cell 10.

As described above, in the memory array 50, the data write operation and the data erase operation are switched by merely inverting the polarity of the voltage applied to the bit line BL02. Thus, 1-bit data can be written to, or erased from, the selected memory cell 10.

For reading data stored in the selected memory cell 10, for example, Vwl=3.0 V is applied to the word line WL02 and Vbl=3.0 V (which is lower than the voltage used for writing data, 5.0 V) is applied to the bit line BL02. The voltages applied to the non-selected word lines WL00, WL01 and WL03 through WL0n−1 and the non-selected bit lines BL00, BL01 and BL03 through BL0n−1 are set as Vwl=Vbl=0 V. As a result, a BL current flowing in the bit line BL02 is compared with the BL current flowing in the reference cell as a reference memory cell. Thus, the data is read from the selected memory cell 10.

As described above, the memory array 50 allows data to be written to, or erased from, a selected memory cell 10 as follows. A prescribed MOS transistor is selected by selecting a word line and a bit line in accordance with the address of the corresponding memory cell 10. A data write voltage or a data erase voltage is applied to the variable resistor 30 connected to the selected MOS transistor via the bit line.

Owing to such a system, the memory array 50 can store multi-value information. Even when incorrect data is written, the data can be erased bit by bit, i.e., from each memory cell 10. Thus, data write and data erase can be performed at high speed (i.e., in a short time).

Exemplary operations for writing data to the memory array 50 (FIG. 2) will be described in more detail.

Figure 3:
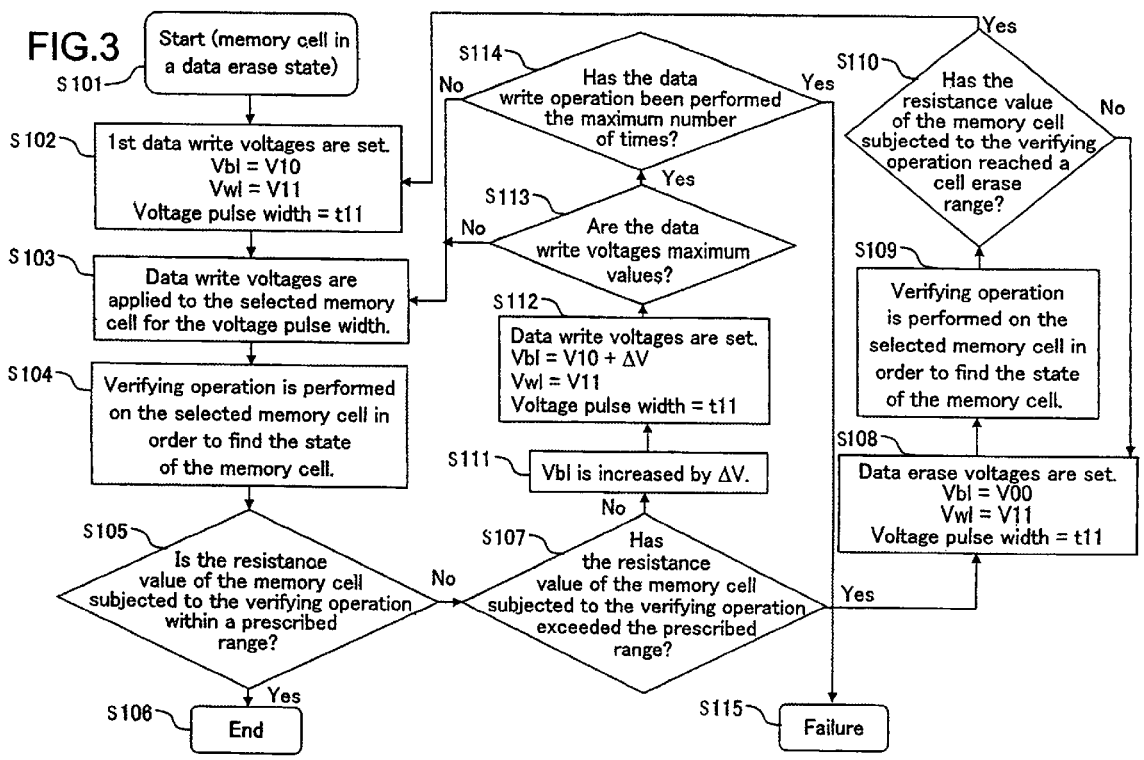
FIG. 3 is a flowchart illustrating a first data write method for writing data into the memory array shown in FIG. 2.

FIG. 3 is a flowchart illustrating a first data write method for writing data to the memory array 50 according to the present invention.

First, a memory cell 10 in a data erase state is selected, and a data write operation to the selected memory cell 10 is started (step S101).

Next, first data write (program) voltages are set as follows (step S102).
(1) Vbl=V10 (voltage to be applied to the bit line BL)
(2) Vwl=V11 (voltage to be applied to the word line WL)
(3) t=t11 (voltage pulse width of Vwl and Vbl)
For example, Vbl=V10=5.0 V, Vwl=V11=3.0 V, and t=t11=50 nsec.

Next, the first data write voltages of Vwl and Vbl are applied to the selected memory cell 10 for voltage pulse width t11 (step S103).

After the first data write voltages are applied, a verifying operation is performed to find whether or not the resistance value of the variable resistor 30 of the selected memory cell 10 to which data has been written (which is programmed) is within a prescribed range (step S104). The verifying operation is an operation for checking the resistance value of the variable resistor 30 to confirm whether or not data (information) has been written to the selected memory cell 10 as expected.

When the resistance value of the variable resistor 30 is in the prescribed range (YES in step S105), the data write operation is completed (step S106).

When the resistance value of the variable resistor 30 has exceeded the prescribed range (YES in step S107), the data erase voltages are set as follows and applied to the selected memory cell 10 (step S108).
(1) Vbl=V00 (voltage to be applied to the bit line BL)
(2) Vwl=V11 (voltage to be applied to the word line WL)
(3) t=t11 (voltage pulse width of Vwl and Vbl)

For example, Vbl=V00=−5.0 V, Vwl=V11=3.0 V, and t=t11=50 nsec. The polarity of the data erase voltage Vbl (=−5.0 V) is opposite to the polarity of the first data write voltage Vbl (=5.0 V).

After the data erase voltages are applied, a verifying operation is performed to find whether or not the resistance value of the variable resistor 30 of the selected memory cell 10, from which the data has been erased, is within a data erase range (step S109). The verifying operation is an operation for checking the resistance value of the variable resistor 30 to confirm whether or not data (information) has been erased from the selected memory cell 10 as expected.

When the resistance value of the variable resistor 30 of the non-volatile semiconductor memory cell 10 subjected to the verifying operation has not reached the data erase range (NO in step S110), the data erase voltages are applied again to the memory cell 10 to perform the verifying operation (steps S108 through S110). Steps 108 through S110 are repeated until the memory cell 10 is put into a data erase state, i.e., until the resistance value of the variable resistor 30 reaches the data erase range. When the memory cell 10 is put into the data erase state, the first data write voltages are applied to the memory cell 10 to execute the data write operation again.

When the resistance value of the variable resistor 30 has not yet reached the prescribed range (NO in step S107), the data write voltages are applied again to write data to the memory cell 10 and the verifying operation is performed again.

In this case, the first data write voltage Vbl is increased by a prescribed voltage value ($\Delta$V), for example, 0.5 V, to Vbl=5.5 V (step S111).

Next, second data write voltages are set as follows (step S112).
(1) Vbl=V10+$\Delta$V (in step S112)
(2) Vwl=V11
(3) t=t11
For example, Vbl=V10+$\Delta$V=5.5 V, Vwl=V11=3.0 V, and t=t11=50 nsec.

Next, until the second data write voltage Vbl, and the number of times that the data write operation to the memory cell 10 (programming) has been performed, both reach the maximum values (steps S113 and S114), steps S103 through S114 are repeated such that the resistance value of the variable resistor 30 reaches the prescribed range.

When the second data write voltage Vwl, and the number of times that the data write operation to the memory cell 10 (programming) has been performed, both reach the maximum values (YES in steps S113 and S114), the data write operation to the memory cell 10 results in a failure (step S115).

As described above, according to the first data write method for writing data of the present invention, even when the resistance value of the variable resistor 30 of a certain non-volatile semiconductor memory device 10 has exceeded a prescribed range, data can be written at high speed (i.e., in a short time) without transferring data written in the other memory cells in the block including the certain non-volatile semiconductor memory cell 10 to another block, and without first erasing data in the block including the certain non-volatile semiconductor memory cell 10 and then writing the data again in that block.

Figure 4:
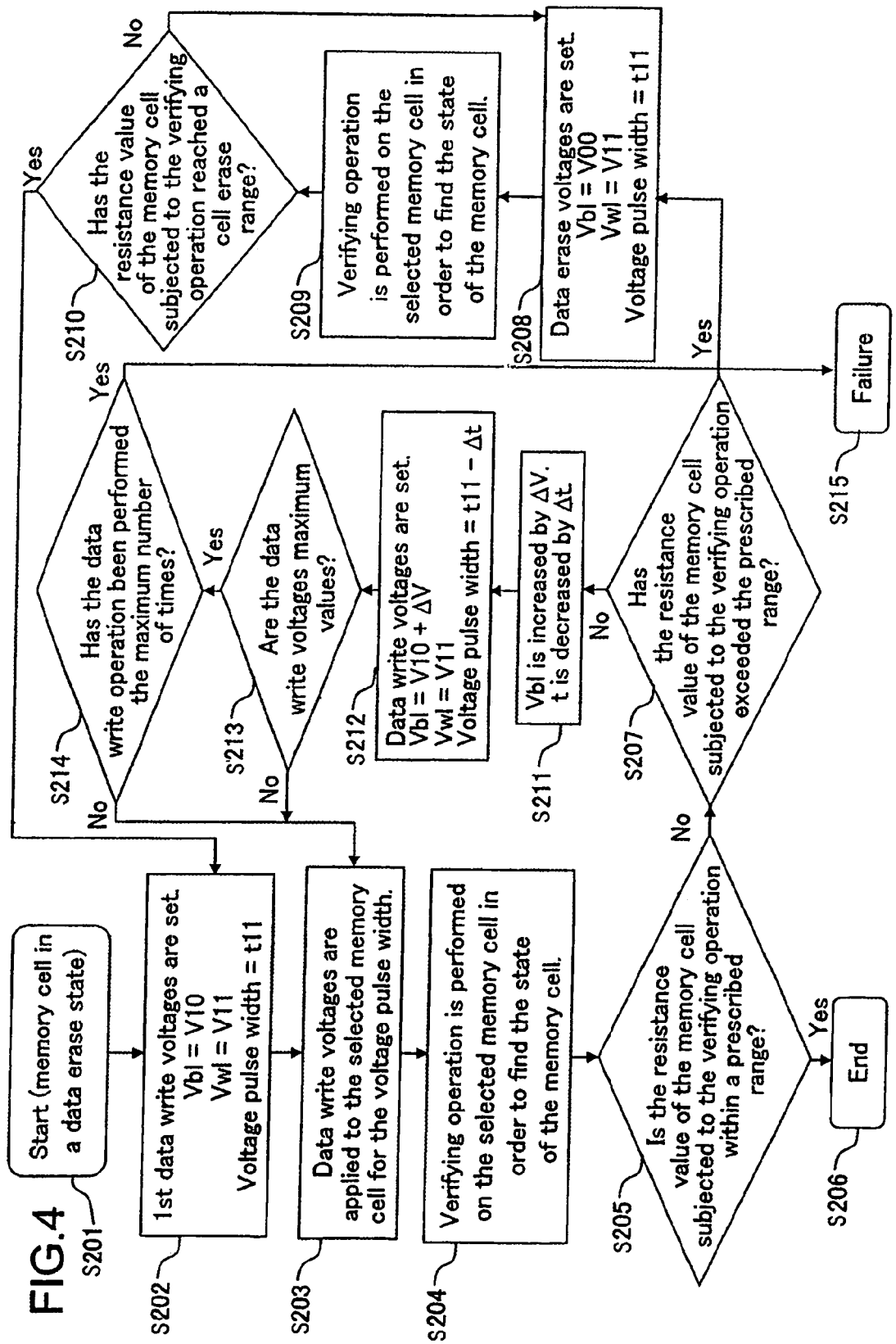
FIG. 4 is a flowchart illustrating a second data write method for writing data into the memory array shown in FIG. 2.

FIG. 4 is a flowchart illustrating a second data write method for writing data to the memory array 50 according to the present invention, as illustrated by steps S201–S215.

According to the second data write method, when the resistance value of the variable resistor 30 of the memory cell 10 to which data has been written has not yet reached a prescribed range (NO in step S207), the data write voltages are applied again for writing data to the memory cell 10, and the verifying operation is performed again.

In this case, the time period in which the data write voltages are applied for the second time and thereafter is set to be shorter than the time period at the previous time (steps S211 through S212). In this manner, the amount of change in the resistance value of the variable resistor 30 of the memory cell 10, which is caused by the increase in the data write voltage Vbl used when the data write voltages are applied for the second time and thereafter, can be controlled with higher precision. In addition, the increase in the power consumption when the data is written can be suppressed. As shown in step S211 in FIG. 4, the time period t in which the data write voltages are applied for the second time and thereafter is shortened by $\Delta t$ (for example, 5 nsec.) and data write voltage Vbl is increased by $\Delta V$ (for example, 0.5 V). For example, the data write voltages for the second time are Vbl=V10+$\Delta V$=5.5 V, Vwl=V11=3.0 V, and t=t11=$\Delta t$=45 nsec.

The second data write method for writing data shown in FIG. 4 is substantially the same as the first data write method for writing data shown in FIG. 3 except for the conditions in steps S211 through S212.

The first and second data write methods for writing data shown in FIGS. 3 and 4 are effective for a non-volatile semiconductor memory cell capable of storing multi-value information, but provides the same effect for a non-volatile semiconductor memory cell capable of storing 2-value information.

Figure 5:
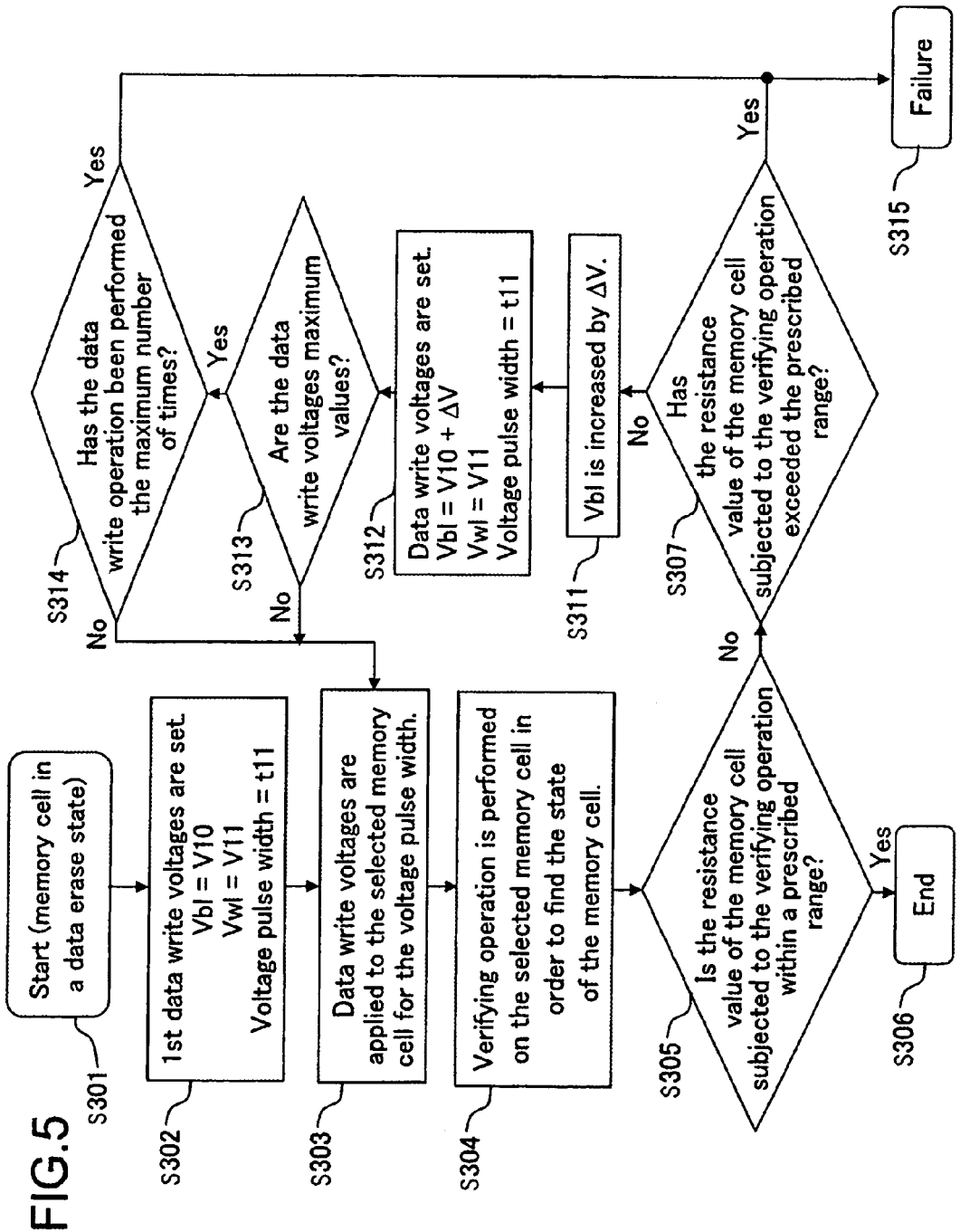
FIG. 5 is a flowchart illustrating a third data write method for writing data into the memory array shown in FIG. 2.

FIG. 5 is a flowchart illustrating a third data write method for writing data to the memory array 50 according to the present invention.

First, a memory cell 10 in a data erase state is selected, and a data write operation to the selected memory cell is started (step S301).

Next, first data write (program) voltages are set as follows (step S302).
 (1) Vbl=V10 (voltage to be applied to the bit line BL)
 (2) Vwl=V11 (voltage to be applied to the word line WL)
 (3) t=t11 (voltage pulse width of Vwl and Vbl)
For example, Vbl=V10=5.0 V, Vwl=V11=3.0 V, and t=t11=50 nsec.

Next, the first data write voltages of Vwl and Vbl are applied to the selected memory cell 10 for voltage pulse width t11 (step S303).

After the first data write voltages are applied, a verifying operation is performed to find whether or not the resistance value of the variable resistor 30 of the selected memory cell 10 to which data has been written (which is programmed) is within a prescribed range (step S304). The verifying operation is an operation for checking the resistance value of the variable resistor 30 to confirm whether or not data (information) has been written to the selected memory cell 10 as expected.

When the resistance value of the variable resistor 30 is in the prescribed range (YES in step S305), the data write operation is completed (step S306).

When the resistance value of the variable resistor 30 has exceeded the prescribed range (YES in step S307), the data write operation to the memory cell 10 results in a failure (step S315).

When the resistance value of the variable resistor 30 has not yet reached the prescribed range (NO in step S307), the data write voltages are applied again for writing data to the memory cell 10, and the verifying operation is performed again.

In this case, the first data write voltage Vbl is increased by $\Delta V$ (for example, 0.5 V) to Vbl=5.5 V (step S311).

Next, second data write voltages are set as follows (step S312).
 (1) Vbl=V10+$\Delta V$ (in step S311)
 (2) Vwl=V11
 (3) t=t11
For example, Vbl=V10+$\Delta V$=5.5 V, Vwl=V11=3.0 V, and t=t11=50 nsec.

Next, until the second data write voltage Vbl, and the number of times that the data write operation to the memory cell 10 (programming) has been performed, both reach the maximum values (steps S313 and S314), steps S303 through S314 are repeated such that the resistance value of the variable resistor 30 reaches the prescribed range.

When the second data write voltage Vwl, and the number of times that the data write operation to the memory cell 10 (programming) has been performed, both reach the maximum values (YES in steps S313 and S314), the data write operation to the memory cell 10 results in a failure (step S315).

As described above, according to the third data write method for writing data of the present invention, it is set such that when the resistance value of the variable resistor 30 of a certain non-volatile semiconductor memory device 10 has exceeded a prescribed range, the data write operation results in a failure.

In this case, the memory array 50 including the non-volatile semiconductor memory cell 10 can perform as follows. After the data write operation to the memory array 50 is completed, only the data in a memory cell 10 to which incorrect data has been written is erased, and then a data write operation is performed again to only that memory cell 10.

By contrast, in the conventional flash memory, data erase cannot be performed bit by bit. Thus, the third data write method cannot be used. With the conventional flash memory, data erase is performed block by block. When incorrect data is written to a memory cell, it is necessary to (i) first write the data, which has been written to the other memory cells in the same block, to the memory cells in another block, (ii) erase the data in the certain block, and then (iii) write back the data, which has been written to the another block, to the memory cells in the certain block. This significantly extends the time necessary to complete the data write operation.

Unlike such a data write method of the conventional flash memory, the third data write method for writing data according to the present invention allows only the incorrect data written to a memory cell to be replaced with correct data. This shortens the time for the data write operation.

Figure 6:
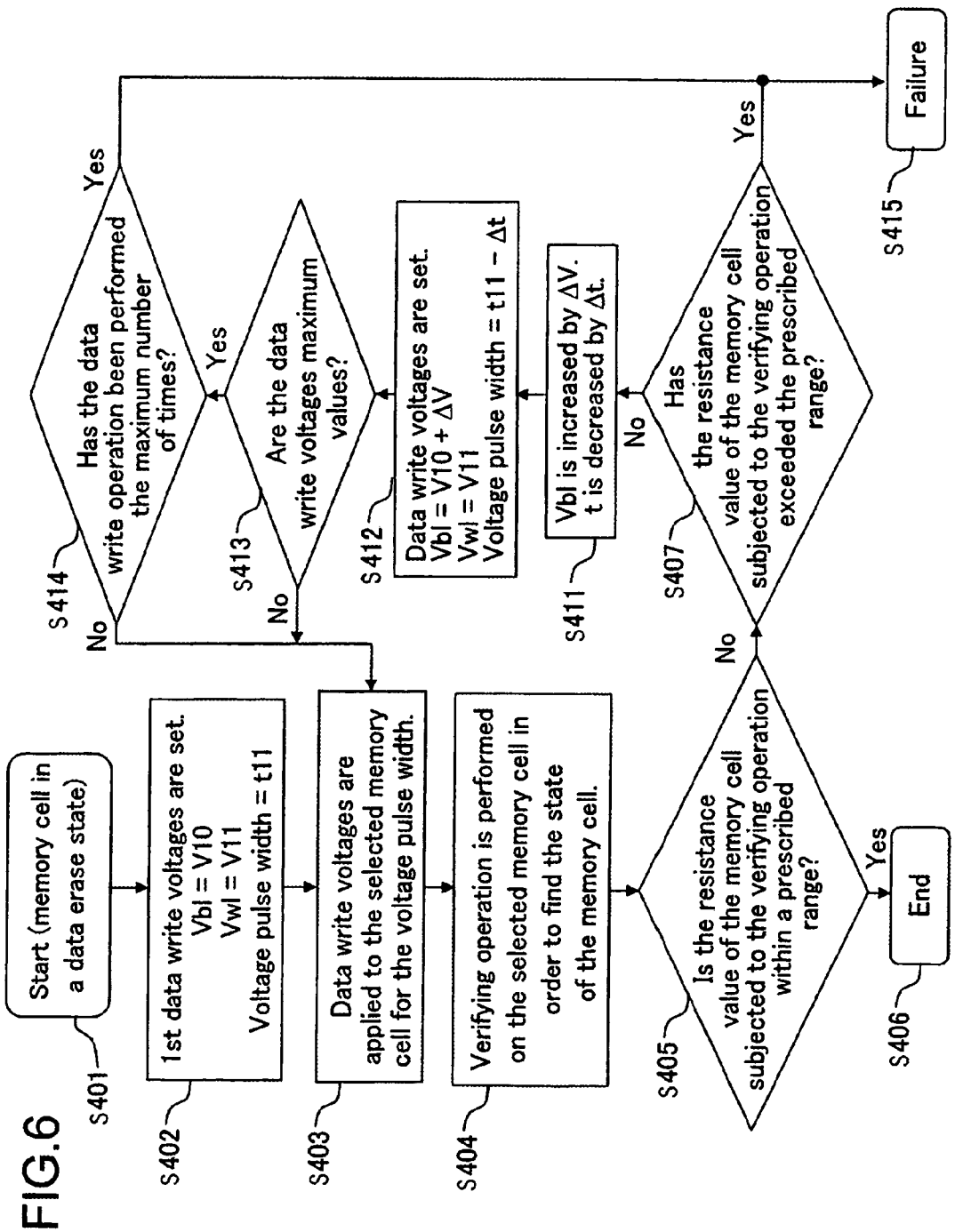
FIG. 6 is a flowchart illustrating a fourth data write method for writing data into the memory array shown in FIG. 2.

FIG. 6 is a flowchart illustrating a fourth data write method four writing data to the memory array 50 according to the present invention, as illustrated by steps S401–S415.

According to the fourth data write method, when the resistance value of the variable resistor 30 of the memory cell 10 to which data has been written has not yet reached a prescribed range (NO in step S407), the data write voltages are applied again for writing data to the memory cell 10, and the verifying operation is performed again.

In this case, the time period in which the data write voltages are applied for the second time and thereafter is set to be shorter than the time period at the previous time (steps S411 through S412). In this manner, the amount of change in the resistance value of the variable resistor 30 of the memory cell 10, which is caused by the increase in the data write voltage Vbl used when the data write voltages are applied for the second time and thereafter, can be controlled with higher precision. In addition, the increase in the power consumption when the data is written can be suppressed. As shown in step S411 in FIG. 6, the time period t in which the data write voltages are applied for the second time and thereafter is shortened by Δt (for example, 5 nsec.) and data write voltage Vbl is increased by ΔV (for example, 0.5 V). For example, the data write voltages for the second time are Vbl=V10+ΔV=5.5 V, Vwl=V11=3.0 V, and t=t11−Δt=45 nsec.

The fourth data write method for writing data shown in FIG. 6 is substantially the same as the third data write method for writing data shown in FIG. 5 except for the conditions in steps S411 through S412.

The third and fourth data write methods for writing data shown in FIGS. 5 and 6 are effective for a non-volatile semiconductor memory cell capable of storing multi-value information, but provides the same effect for a non-volatile semiconductor memory cell capable of storing 2-value information.

Although not shown, the memory array 50 according to one example of the present invention is usually connected to a bit line driving circuit for applying a driving voltage to the bit lines; a word line driving circuit for applying a driving voltage to the word lines; a control circuit for controlling the operations of the bit line driving circuit and the word line driving circuit; a power supply circuit for supplying the bit line driving circuit and the word line driving circuit with a data write voltage, a data erase voltage and a data read voltage; and a sense circuit for, when reading data, comparing the value of the current in the non-volatile semiconductor memory cell from which data is to be read, with the value of the current in the reference cell as the reference. In this case, the memory array 50 selects a prescribed non-volatile semiconductor memory cell corresponding to the input address information supplied from the bit line driving circuit and the word line driving circuit, and executes the data write operation, the data erase operation and the data read operation.

In the above description, the variable resistor 30 is connected to the drain region 23 of the transistor 20, but the present invention is not limited to such a structure. The variable resistor 30 may be connected to the source 22 of the transistor 20.

In a semiconductor memory device according to the present invention, a memory cell corresponding to the input address information includes a variable resistor and a transistor connected to the variable resistor. The resistance value of the variable resistor between a pair of electrodes is reversibly changed by the value of the voltage applied between the electrodes, and the variable resistor retains the resistance value even after the voltage application is terminated. Owing to such a structure, the semiconductor memory device allows data to be erased on a memory-cell-by-memory-cell basis, and data can be written at high speed (i.e., in a short time) and with high precision.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device including a plurality of memory cells, wherein one of the plurality of memory cells includes a variable resistor having a resistance value thereof reversibly changed in accordance with a voltage applied thereto, and a transistor connected to the variable resistor, wherein the resistance value is increased by application of a voltage having a prescribed polarity to one end of the variable resistor and by application of a voltage having a same polarity as the prescribed polarity to the other end of the variable resistor, and the resistance value is decreased by application of a voltage having a prescribed polarity to one end of the variable resistor and by application of a voltage having an opposite polarity with respect to the prescribed polarity to the other end of the variable resistor.

2. A semiconductor memory device according to claim 1, wherein the transistor is a MOS transistor.

3. A semiconductor memory device according to claim 1, wherein the resistance value of the variable resistor is set to reach a plurality of non-overlapping ranges.

4. A semiconductor memory device according to claim 1, wherein the variable resistor is formed of a material having a perovskite type crystalline structure.

5. A semiconductor memory device according to claim 1, wherein:

the transistor includes a source, a gate, and a drain, and one of the source and the drain is connected to a bit line via the variable resistor, and the gate is connected to a word line.

6. A semiconductor memory device according to claim 5, wherein a voltage of a prescribed polarity is applied to the bit line, and a voltage lower than the voltage of the prescribed polarity is applied to the word line, so that the one memory cell is selected from the plurality of memory cells and data is written to the one memory cell.

7. A semiconductor memory device according to claim 6, wherein a voltage of a polarity opposite to the prescribed polarity is applied to the bit line, and a voltage lower than the voltage of the prescribed polarity is applied to the word line, so that the one memory cell is selected from the plurality of memory cells and data is erased from the one memory cell.

8. A data write method for writing data to a memory cell, wherein the memory cell includes a variable resistor having a resistance value thereof reversibly changed in accordance with a voltage applied thereto, and a transistor connected to the variable resistor, the data write method comprising:

a first step of applying a first data write voltage to the memory cell;

a second step of, after the first data write voltage is applied, determining whether or not the resistance value of the variable resistor is within a prescribed range;

a third step of, when the resistance value of the variable resistor has not reached the prescribed range, applying a second data write voltage which is higher than the first data write voltage to the memory cell; and a fourth step of repeating the second step and the third step until the resistance value of the variable resistor reaches the prescribed range, wherein the resistance value is increased by application of a voltage having a prescribed polarity to one end of the variable resistor and by application of a voltage having a same polarity as the prescribed polarity to the other end of the variable resistor, and the resistance value is decreased by application of a voltage having a prescribed polarity to one end of the variable resistor and by application of a voltage having an opposite polarity with respect to the prescribed polarity to the other end of the variable resistor.

9. A data write method according to claim 8, further comprising:
   a fifth step of, when the resistance value of the variable resistor exceeds the prescribed range, applying a data erase voltage to the variable resistor;
   a sixth step of, after the data erase voltage is applied, determining whether or not the resistance value of the variable resistor has reached a data erase range; and
   a seventh step of repeating the fifth step and the sixth step until the resistance value of the variable resistor reaches the data erase range and then applying the first data write voltage to the memory cell.

10. A data write method according to claim 8, wherein the third step includes a step of applying the second data write voltage in a time period which is shorter than a time period in which the first data write voltage is applied in the first step.

* * * * *